(12) United States Patent
Bohn

(10) Patent No.: US 6,512,387 B1
(45) Date of Patent: Jan. 28, 2003

(54) PRESSURE-SENSITIVE SYSTEM AND METHOD OF TESTING ELECTRONIC DEVICE INTERCONNECTIONS

(75) Inventor: David D Bohn, Ft Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 36 days.

(21) Appl. No.: 09/919,256

(22) Filed: Jul. 31, 2001

(51) Int. Cl.[7] .............................................. G01R 31/02
(52) U.S. Cl. .................................... 324/754; 324/158.1
(58) Field of Search ................................ 324/754, 755, 324/750–753, 158.1; 382/146, 149

(56) References Cited

U.S. PATENT DOCUMENTS 5,406,210 A * 4/1995 Pedder ........................ 324/757
5,757,193 A * 5/1998 Yu et al. ..................... 324/501

OTHER PUBLICATIONS

Sensor Products Inc., "PressureX–micro Imaging System" (online), retrieved on Jul. 10, 2001), Retrieved from the Internet <URL: http//www.sensorprod.com/ sales@sensorprod.com>.

Prescale, "The Debut of FPD–901E Series makes pressure analysis much easier and faster then ever!" (online). (retrieved on Jul. 10, 2001), Retrieved from the Internet<URL:http//www.prescale.com/E/E_FPD901.htm>.

* cited by examiner

Primary Examiner—Kamand Cuneo
Assistant Examiner—Tung X. Nguyen
(74) Attorney, Agent, or Firm—Kyle J. Way

(57) ABSTRACT

A system and method of testing the quality of electronic device interconnections uses a pressure-sensitive medium. The interconnections of the electronic device are placed in contact with the pressure-sensitive medium. Force is then applied to the device so that an indication of the pressure exerted by each interconnection is produced by the pressure-sensitive medium. The indication of the pressure exerted by each interconnection is then analyzed to determine the quality of the connections of the electronic device.

22 Claims, 5 Drawing Sheets

PRESSURE-SENSITIVE SYSTEM AND METHOD OF TESTING ELECTRONIC DEVICE INTERCONNECTIONS

BACKGROUND OF THE INVENTION

As the number of interconnections on various types of electronic devices increases, the task of testing the quality of such interconnections becomes progressively more difficult. For example, pin grid arrays (PGAs), ball grid arrays (BGAs), chip scale packages (CSPs), and standard leaded components regularly employ well over one hundred interconnections, each of which is critical to the proper performance of the device. Additionally, probes for testing printed circuit boards, electronic components such as integrated circuits (ICs), and IC wafers must also be tested for quality prior to being employed in the test environment. Such probes may number in the thousands, further exacerbating the problems of testing such interconnections. As manual visual inspection of such interconnections and probes is necessarily slow and error-prone, automated systems have been devised to perform such inspection.

Currently, the quality of most IC interconnections is tested using structured or laser light. For example, structured light may be used to illuminate a single interconnection or a row of interconnections at an oblique angle, creating shadows of the interconnections. Given the expected size and shape of the interconnections and the angle of incident light, an expected shadow size and shape can be determined and compared to the actual shadow cast by the interconnection to determine the quality of the interconnection. Alternately, laser light can be projected substantially from the side of the connections so that opposing light detectors, by virtue of the laser light received, may be employed to determine if any interconnections are missing or are too short to be effective. Unfortunately, such systems generally require rather complex and expensive optics. Also, since these systems typically test one interconnection or row of interconnections at a time, inspection time per electronic device tends to be rather long. Additionally, the use of light-based inspection systems are susceptible to poor interconnections remaining undetected due to problems inherent in testing interconnections residing toward the center of an interconnection array by the use of structured light, due to the shadows cast by the surrounding interconnections.

From the foregoing, a new system and method of testing electronic device interconnections that requires no special optics, reduces the amount of testing time per device, and reduces the possibility of undetected interconnection defects would be advantageous.

SUMMARY OF THE INVENTION

Embodiments of the invention, to be discussed in detail below, provide a system and method for testing the quality of electronic device interconnections by way of a pressure-sensitive medium, such as, for example, a pressure-sensitive film. The interconnections of an electronic device are placed in contact with the pressure-sensitive medium, possibly by way of a robotic actuator. A mechanical force is then applied to the electronic device so that each interconnection of the electronic device exerts substantially identical pressure on the pressure-sensing medium, assuming no defects in the interconnections exist. As a result of the applied force, the pressure-sensitive means produces an indication of the pressure exerted by each interconnection. That indication is then analyzed, possibly by way of a camera and associated computer, to determine the quality of the interconnections.

Other aspects and advantages of the invention will become apparent from the following detailed description, taken in conjunction with the accompanying drawings, illustrating by way of example the principles of the invention.

DETAILED DESCRIPTION OF THE PREFERRED EMBODIMENTS

Figure 1:
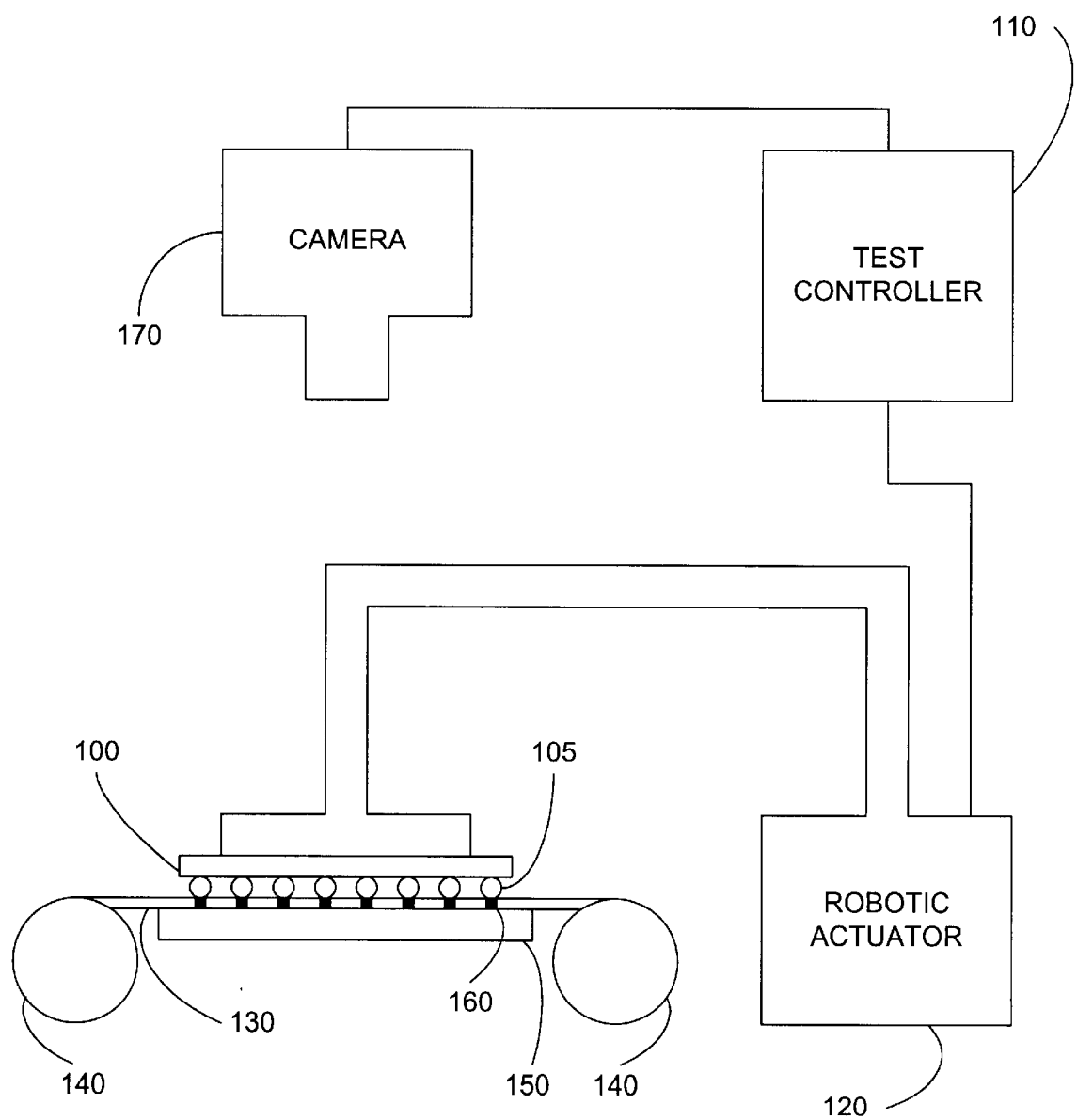
FIG. 1 is a block diagram of an electronic device interconnection quality test system according to an embodiment of the invention.

A system of testing the quality of interconnections of an electronic device according to an embodiment of the invention is shown in FIG. 1. An electronic device 100 has a plurality of interconnections 105 that extend from the main body of electronic device 100. In FIG. 1, electronic device 100 is a ball grid array (BGA) package holding an integrated circuit (IC) (not visible). Many other types of IC packages may be tested using embodiments of the invention, including standard leaded through-hole and surface mount packages, chip-scale packages (CSPs), pin grid array (PGA) packages, and other area array packages. Additionally, interconnections for larger electronic devices, such as bed-of-nails testers for printed circuit boards, ICs, various electronic components, and IC wafers, may also be tested using such a system.

In the embodiment of FIG. 1, electronic device 100 is placed so that interconnections 105 make contact with a pressure-sensitive film 130. Furthermore, the embodiment utilizes a substantially flat surface 150 against which film 130 is pressed by interconnections 105. Film 130, versions of which are manufactured by companies such as Fuji Photo Film and Sensor Products, Inc., displays a predetermined color in areas where pressure has been applied, thus displaying a visual image on the film representing areas on which a particular amount of pressure on the film has been exceeded. Generally speaking, the color generated is initially contained in microcapsules within the film that burst when an imposed external pressure is exceeded. The visual image, as will be shown later, thus provides an indication of the quality of interconnections 105.

At least three different types of pressure-sensitive film 130 are contemplated by the invention. In a binary type of film, all of the microcapsules burst at the same pressure level, thus indicating the areas where the pressure imposed met or exceeded a particular predetermined pressure level. A gray-scale type of film integrates microcapsules that burst at varying pressure levels. As a result, the color density in a particular area is associated with the amount of pressure applied to that area. In other words, the more dense the color in an area, the greater the pressure that was applied directly to that area, thus providing greater pressure-sensing resolution than binary films. Gray-scale films are the most common type currently being manufactured in the pressure-sensitive film industry. Alternately, embodiments of the present invention contemplate the use of color pressure-sensitive film, whereby different pressures are indicated by varying colors on the film, providing comparable pressure resolution to gray-scale films, resulting in more accurate test results than binary films.

In FIG. 1, a mechanical force is applied to electronic device 100 by a robotic actuator 120, which is normally controlled by a test controller 110. Test controller 110 may be any algorithmic controller, such as a general-purpose computer or a microcontroller-based embedded controller. Robotic actuator 120 is capable of accurately applying a predetermined amount of force to electronic device 100 that is appropriate for electronic device 100 and the type of film 130 involved. Such force is applied evenly to electronic device 100 so that all interconnections 105 exert substantially identical pressure on film 130, assuming that all interconnections 105 are of acceptable quality. Additionally, for the sake of automation in a manufacturing environment, robotic actuator 120 could be capable of placing electronic device 100 in contact with film 130 prior to the testing of device 100, as well as removing device 100 from film 130 after the test has been completed. Alternately, electronic device 100 may be placed onto and removed from film 130 manually, or a separate robotic actuator (not shown) may be used for that purpose.

Due to the permanent nature of the visual image on pressure-sensitive film 130 after pressure has been applied, a new portion of film 130 is required for each electronic device 100 tested. Replacement of film 130 for each new device may be performed manually. To automate the film replacement process, film 130 could be fashioned as a long strip loaded onto a pair of motor-driven spools 140, as shown in FIG. 1. Such a mechanism would allow film 130 to be advanced a sufficient amount so that a previously unused portion of film 130 would be available for each electronic device 100 to be tested.

Once mechanical force has been applied to electronic device 100, thereby creating a visual image 160 of the pressure exerted by interconnections 105 on film 130, visual image 160 must be analyzed to determine the quality of interconnections 105. Once electronic device 100 has been removed from film 130, camera 170 generates an electronically recorded image of visual image 160 on film 130. Camera 170 then transmits the electronically recorded image to test controller 110, which then analyzes the electronically recorded image to determine the quality of interconnections 105.

Camera 170, in some embodiments, is a typical area array camera. Alternately, camera 170 could be a line scan camera, which typically results in the generation of a higher-resolution electronically recorded image. Such additional resolution may be required or desired, depending on the type of electronic device 100 being tested and the type of film 130 being employed.

Figure 2:
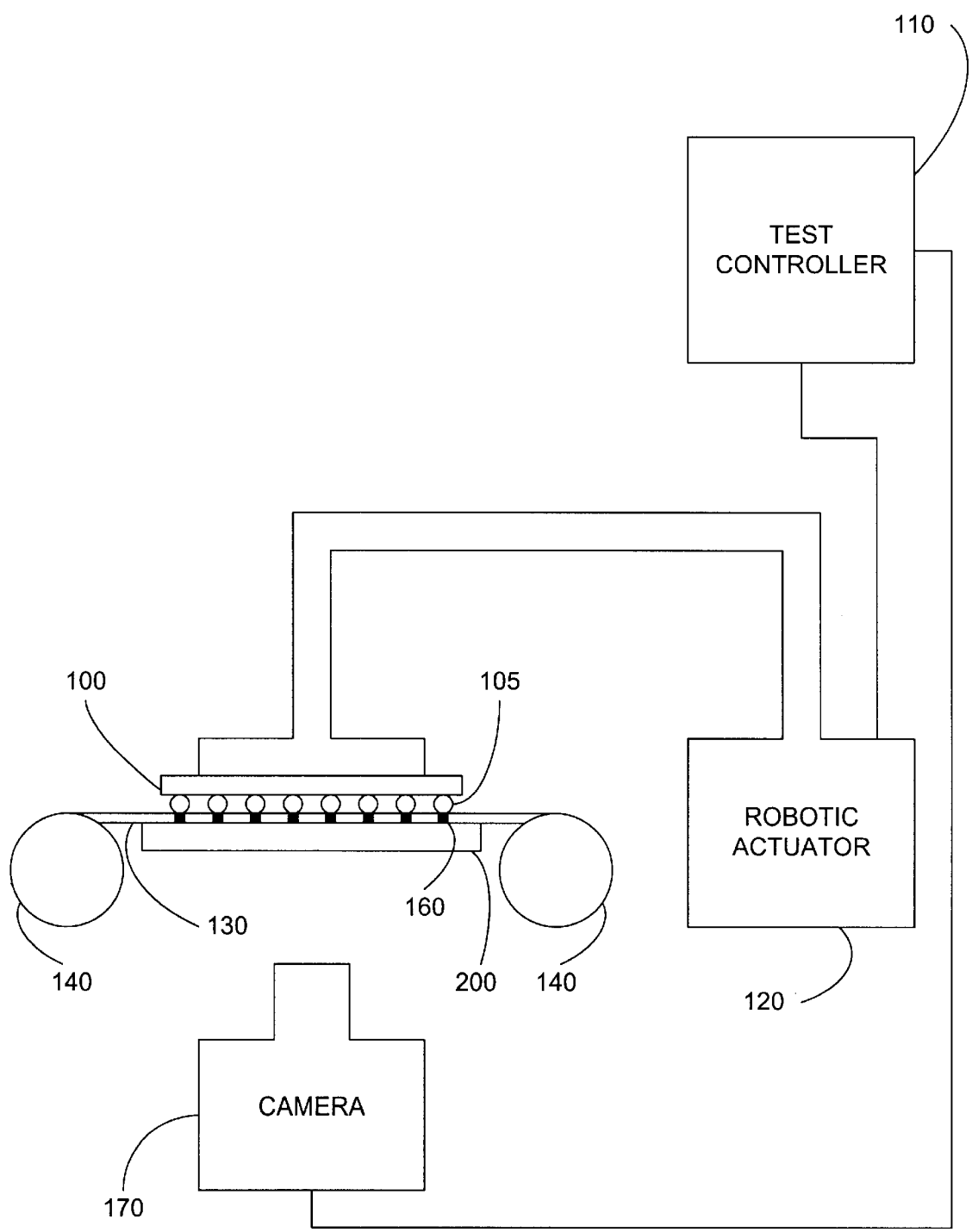
FIG. 2 is a block diagram of an electronic device interconnection quality test system according to another embodiment of the invention.

A second embodiment of the invention, as depicted in FIG. 2, allows camera 170 to generate the electronically recorded image while electronic device 100 is still in contact with film 130. In this instance, camera 170 is situated on the opposing side of film 130 from electronic device 100. A transparent platen 200 is utilized as a more specific type of flat surface 150 (from FIG. 1) so that camera 170 may have direct line of sight to film 130 prior to the removal of electronic device 100 from film 130. A benefit of this embodiment is that several electronically recorded images of the visual image on film 130 may be generated at increasing levels of force applied on electronic device 100. The additional information gathered from multiple electronically recorded images at different applied pressures could further aid in determining the quality of interconnections 105.

Figure 3:
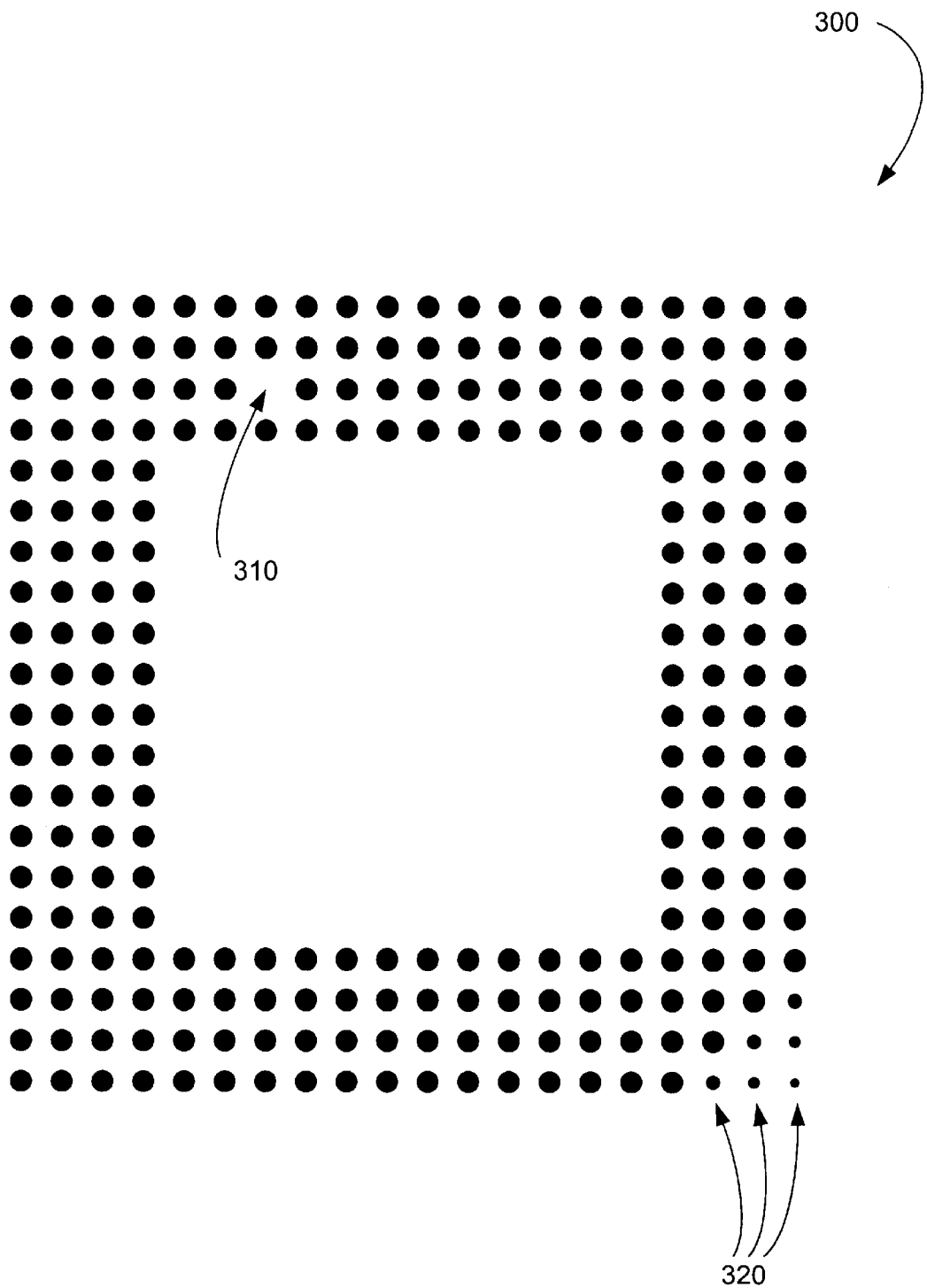
FIG. 3 is an example of a visual image on binary pressure-sensitive film resulting from interconnection quality testing according to an embodiment of the invention.

FIG. 3 displays an example binary visual image 300 on film 130 produced by interconnections 105 of electronic device 100, which, in this case, is a 256-interconnection BGA. Since film 130 is binary in this particular case, no gray levels are depicted. Therefore, the quality of interconnections 105 is determined by the presence, location, and size of the dark areas of image 300. For example, a missing spot 310, in a location where a BGA solder ball would be expected, indicates a poor or nonexistent interconnection. Other problems, such as coplanarity, may also be detected. For instance, a warped BGA package, which is one example of a coplanarity problem, may result in small spots 320 being smaller when compared to others generated by interconnection 105 of the BGA package. Such small spots 320 would thus indicate that less pressure is being applied by the associated interconnection at that corner of the package, possibly resulting in poor connectivity when the package is installed in the electronic system for which it was intended.

Figure 4:
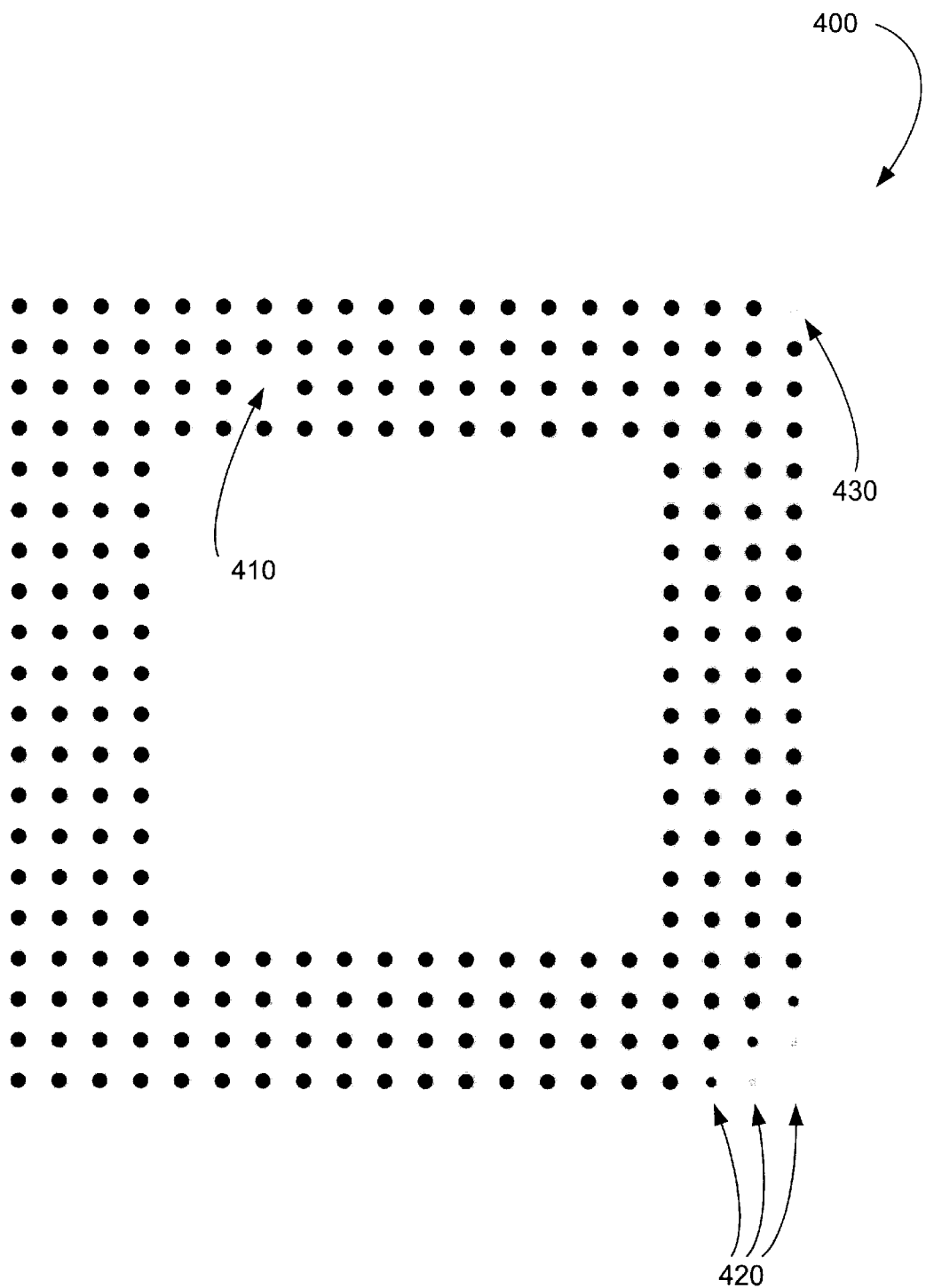
FIG. 4 is an example of a visual image on gray-level or color pressure-sensitive film resulting from interconnection quality testing according to an embodiment of the invention.
Figure 5:
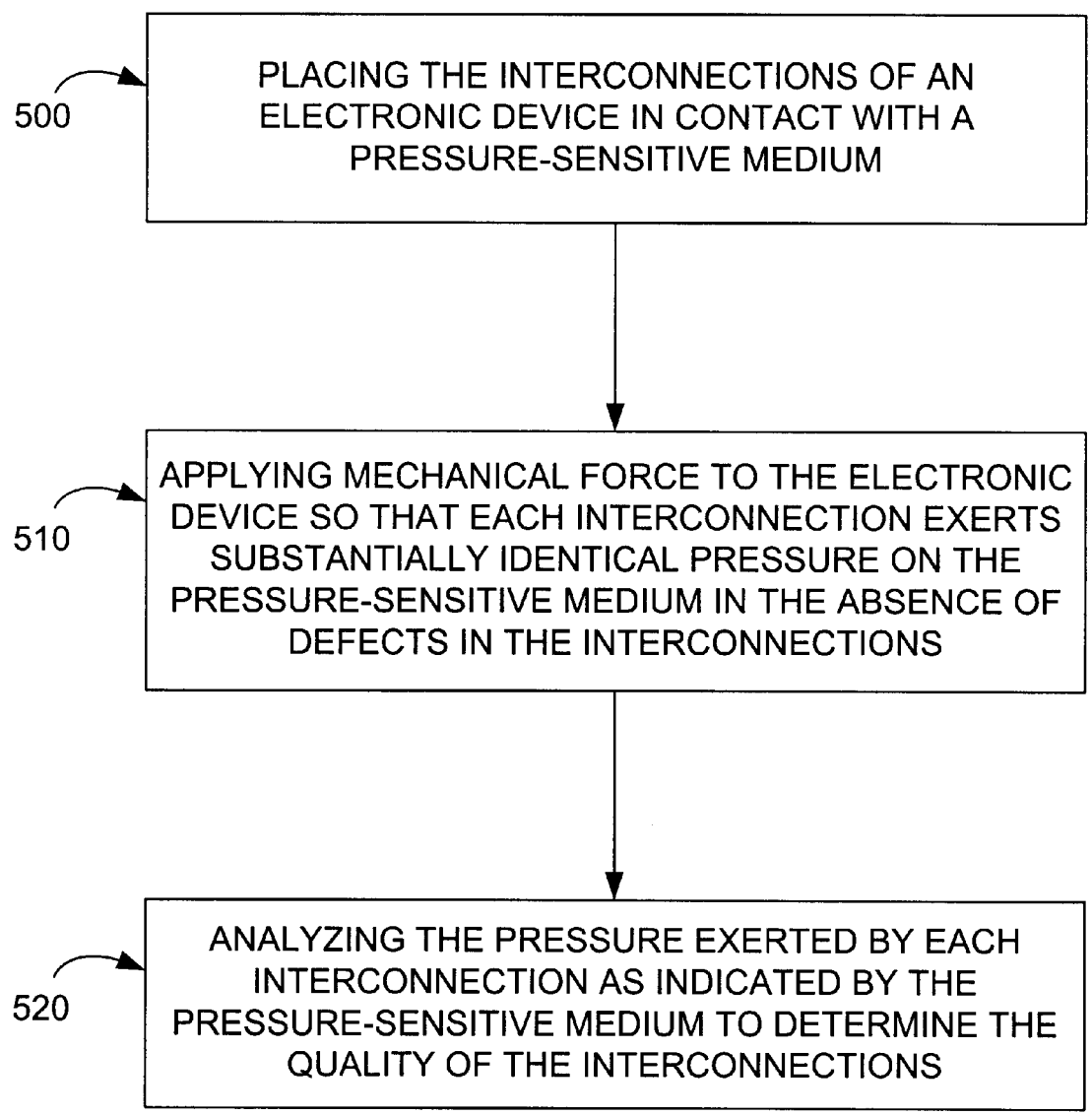
FIG. 5 is a flow chart of a method of testing the interconnections of an electronic device according to an embodiment of the invention.

A related visual image 400 is shown in FIG. 4 using the same BGA package. Image 400 is either gray-scale or color in nature, derived from either a gray-scale or color pressure-sensitive film. In the ideal case, each spot of a high quality interconnection would be indicated by a set of concentric rings of a single color with varying intensity, or concentric rings of varying color, thus indicating the spherical nature of the solder balls. A missing or short ball would still be indicated by a missing spot 410, as was the case with binary image 300. The coplanarity problem of the BGA package would also be detected in image 400, with smaller, lighter spots 420 indicating that those solder balls were not residing in the same plane as the majority of those attached to the package. Additionally, due to the gray-scale or color nature of the film, a light spot 430 may be seen, indicating that the associated solder ball is probably flatter than others on the package, therefore possibly causing an interconnection problem.

Use of gray-scale or color pressure-sensitive film would also enhance the testing of spring-loaded interconnection pins of bed-of-nails testers commonly used for PCBs, ICs, and IC wafers. The pressure of such pins is normally critical to the ability of the tester to accurately detect errors in the devices under test, as pins that exert too little pressure may not make proper contact with the device, while those that exert too much pressure may prevent surrounding pins from making proper contact with the device. Thus, an indication of how much spring pressure is associated with each interconnection pin aids in detecting testability problems before the bed-of-nails tester is placed into service.

The present invention is also embodied as a method of testing the quality of electronic device interconnections by way of mechanical pressure measurements. First, the interconnections of an electronic device to be tested are placed in contact with a pressure-sensitive medium, such as, for example, pressure-sensitive film (step 500). A mechanical force is then applied to the electronic device so that each interconnection exerts substantially identical pressure on the pressure-sensitive medium, assuming that no defects exist in the interconnections (step 510). As a result of this force, an indication of the pressure exerted by each of the interconnections is produced on the pressure-sensitive medium. Finally, the indication of the pressures on the medium is analyzed to determine the quality of each of the connections on the electronic device (step 520).

From the foregoing, the embodiments of the invention have been shown to provide an effective electronic device interconnection quality testing system and method that utilizes mechanical pressure to discover defects in the device interconnections. As each interconnection of an electronic device is tested simultaneously, testing time is limited. Also, since special lighting is not required, the expense of special optics, and the difficulties inherent in using structured light for testing such interconnections, is eliminated. Other specific systems and methods embodying the invention are also possible. Therefore, the present invention is not to be limited to the specific forms so described and illustrated; the invention is limited only by the claims.

What is claimed is:

1. A system for testing the quality of interconnections of electronic devices, comprising:
    means for sensing mechanical pressure;
    means for placing the interconnections of an electronic device in contact with the pressure-sensing means;
    means for applying a mechanical force to the electronic device so that each interconnection of the electronic device exerts substantially identical pressure on the pressure-sensing means in the absence of defects in the interconnections, the pressure-sensing means producing an indication of the pressure exerted by each interconnection; and
    means for analyzing the pressure exerted by each interconnection of the electronic device as indicated by the pressure-sensing means to determine the quality of the interconnections.

2. The system of claim 1, wherein the force-applying means is capable of applying several different magnitudes of force on the electronic device so that the quality of the interconnections of the electronic device may be analyzed at multiple magnitudes of force by the analyzing means.

3. The system of claim 1, wherein the pressure-sensing means is a pressure-sensitive film that indicates the pressure exerted by the interconnections of the electronic device by way of a visual image on the film.

4. The system of claim 3, wherein the pressure-sensitive film is a binary pressure-sensitive film.

5. The system of claim 3, wherein the pressure-sensitive film is a gray-scale pressure-sensitive film that indicates different contact pressures by different intensities of a single color.

6. The system of claim 3, wherein the pressure-sensitive film is a color pressure-sensitive film that indicates different contact pressures by different colors.

7. The system of claim 3, further comprising a pair of motor-driven spools upon which a roll of the pressure-sensitive film resides so that subsequent electronic devices may be tested using a previously unused portion of the pressure-sensitive film by advancing the motor-driven spools.

8. The system of claim 3, wherein the analyzing means further comprises a camera that generates an electronically recorded image based on the visual image indicated on the pressure-sensitive film, and a test controller that interprets the electronically recorded image from the camera to determine the quality of the interconnections.

9. The system of claim 8, wherein the camera is an area array camera.

10. The system of claim 8, wherein the camera is a line scan camera.

11. The system of claim 3, wherein the force-applying means further comprises a robotic actuator and a flat surface, the robotic actuator applying pressure to the electronic device, the pressure-sensitive film being pressed between the interconnections of the electronic device and the flat surface.

12. The system of claim 11, wherein the flat surface is a transparent platen.

13. The system of claim 3, wherein the placing means is a robotic actuator.

14. A system for testing the quality of interconnections of electronic devices, comprising:
    a pressure-sensitive film;
    a flat surface;
    a robotic actuator that places the interconnections of an electronic device in contact with the pressure-sensitive film, the robotic actuator also applying a mechanical force to the electronic device so that each interconnection of the electronic device exerts substantially identical pressure on the pressure-sensitive film in the absence of defects in the interconnections, the pressure-sensitive film being pressed between the interconnections and the flat surface, the pressure-sensitive film producing an indication of the pressure exerted by each interconnection by way of a visual image on the film;
    a camera that generates an electronically recorded image based on the visual image indicated on the pressure-sensitive film; and
    a test controller that interprets the electronically recorded image from the camera to determine the quality of the interconnections.

15. The system of claim 14, wherein the pressure-sensitive film is a binary pressure-sensitive film.

16. The system of claim 14, wherein the pressure-sensitive film is a gray-scale-pressure-sensitive film that indicates different contact pressures by different intensities of a single color.

17. The system of claim 14, wherein the pressure-sensitive film is a color pressure-sensitive film that indicates different contact pressures by different colors.

18. The system of claim 14, further comprising a pair of motor-driven spools upon which a roll of the pressure-sensitive film resides so that subsequent electronic devices may be tested using a previously unused portion of the pressure-sensitive film by advancing the motor-driven spools.

19. The system of claim 14, wherein the camera is an area array camera.

20. The system of claim 14, wherein the camera is a line scan camera.

21. The system of claim 14, wherein the robotic actuator is capable of applying several different magnitudes of force on the electronic device so that the quality of the interconnections of the electronic device may be analyzed at multiple magnitudes of force by the test controller.

22. A method for testing the quality of interconnections of electronic devices, comprising the steps of:

placing the interconnections of an electronic device in contact with a pressure-sensitive medium;

applying a mechanical force to the electronic device so that each interconnection of the electronic device exerts substantially identical pressure on the pressure-sensitive medium in the absence of defects in the interconnections, the pressure-sensitive medium producing an indication of the pressure exerted by each interconnection; and analyzing the pressure exerted by each interconnection of the electronic device as indicated by the pressure-sensitive medium to determine the quality of the interconnections.

* * * * *